United States Patent [19]

How et al.

[11] Patent Number: 5,511,082
[45] Date of Patent: Apr. 23, 1996

[54] PUNCTURED CONVOLUTIONAL ENCODER

[75] Inventors: Stephen K. How, San Diego, Calif.; Chris Heegard, Ithaca, N.Y.

[73] Assignee: General Instrument Corporation of Delaware, Chicago, Ill.

[21] Appl. No.: 240,232

[22] Filed: May 10, 1994

[51] Int. Cl.$^6$ .................................................. H03M 13/12
[52] U.S. Cl. ..................................................... 371/43
[58] Field of Search .................................................. 371/43

[56] References Cited

U.S. PATENT DOCUMENTS

| | | | |
|---|---|---|---|
| 4,462,101 | 7/1984 | Yasuda et al. | 371/43 |
| 5,029,331 | 7/1991 | Heichler et al. | 371/43 |

OTHER PUBLICATIONS

Patent Abstracts of Japan, Unexamined Applications, E Field, vol. 13, No. 207, May 16, 1989, The Patent Office Japanese Government, p. 4 E 758, JP-A-01 023 625.
Patent Abstracts of Japan, Unexamined Applications, E Field, vol. 17, No. 599, Nov. 2, 1993, The Patent Office Japanese Government, p. 167 E 1455, JP-A-05 183 449.
Y. Yasuda, et al., "High-Rate Punctured Convolutional Codes for Soft Decision Viterbi Decoding," *IEEE Transactions on Communications*, vol. COM-32, No. 3, Mar., 1984, pp. 315-318.
J. Cain, et al., "Punctured Convolutional Codes of Rate (n-1)/n and Simplified Maximum Likelihood Decoding," *IEEE Transactions on Information Theory*, vol. IT-25, No. 1, Jan., 1979, pp. 97-100.
K. J. Hole, "New Short Constraint Length Rate (N-1)/N Punctured Convolutional Codes for Soft-Decision Viterbi Decoding," *IEEE Transactions on Information Theory*, vol. 34, No. 5, Sep., 1988, pp. 1079-1081.

*Primary Examiner*—Stephen M. Baker
*Attorney, Agent, or Firm*—Barry R. Lipsitz

[57] ABSTRACT

A method and apparatus are provided for convolutionally encoding digital data with a rate 4/5 convolutional code. A nonoptimal rate 1/2, sixteen-state convolutional code is punctured to rate 4/5 using a puncture map of $$\left\{ \begin{matrix} 1000 \\ 1111 \end{matrix} \right\}$$

and octal generators 25, 37 wherein v=4. An incoming data stream is processed using the rate 4/5 code. Punctured rate 3/4 and 6/7 codes are also provided.

4 Claims, 3 Drawing Sheets

PUNCTURED CONVOLUTIONAL ENCODER

BACKGROUND OF THE INVENTION

The present invention relates to the communication of digital data using a rate ¾, ⅘ or 6/7 punctured convolutional code. A method and apparatus in accordance with the present invention provides at least a 0.2 dB coding gain over prior art codes.

Error correcting codes are generally classified into block codes and tree codes. A block code maps m discrete-valued symbols into n discrete-valued symbols using a memoryless coder. Because n is greater than m, redundancy (e.g., parity bits) is introduced in the transmission, which is used to provide error detection and/or correction at the decoder.

A tree code is distinguished from a block code by its encoding process which depends on a past history, or memory, of the input symbols. A type of widely used tree code using binary symbols (i.e., bits) is known as a binary convolutional code. The memory of the encoder is characterized by its state, which is represented as a v-bit binary number. For every m input bits, the encoder outputs n bits based on the m input and v state bits, and then transitions to a next state. The code rate for the convolutional coder is defined by R=m/n<1. Typical rates range from ¼ to ⅞. In real-time, high data rate applications, the state bits v are limited to be less than or equal to six.

One widely-used technique for efficient maximum likelihood (ML) decoding of convolutional codes is the Viterbi algorithm disclosed in A. J. Viterbi and J. K. Omura, *Principles of Digital Communications and Coding*, New York, N.Y., McGraw-Hill, 1979. It is known that decoding of high-rate R convolutional codes can be simplified by using "punctured" codes, which are obtained by periodically deleting some of the output bits of a lower rate code. It is well known that a rate 1/n code can be punctured to rate m/k and can be easily decoded with simple modifications to a rate 1/n decoder. An example of such a decoder is provided in commonly assigned, copending U.S. patent application Ser. No. 08/054,642 filed on May 5, 1993 for "Apparatus and Method for Communicating Digital Data Using Trellis Coding with Punctured Convolutional Codes," incorporated herein by reference.

In the prior art, it had first been the practice to take the best (i.e., optimal) rate ½ codes of v= 2, 3, 4, . . . 8 and puncture them to various rate m/k codes, as described in Y. Yasuda, K. Kashiki and Y. Hirata, "High-Rate Punctured Convolutional Codes for Soft Decision Viterbi Decoding," *IEEE Transactions on Communications*, Vol. COM-32, No. 3, March, 1984, pp. 315–318. In following work, "optimal" rate (n–1)/n codes punctured from general rate ½ codes were reported for n=5, 6, 7, 8 and v=2, 4, . . . 6 in K. J. Hole, "New Short Constraint Length Rate (N–1)/N Punctured Convolutional Codes for Soft-Decision Viterbi Decoding," *IEEE Transactions on Information Theory*, Vol. IT-34, No. 5, September, 1988, pp. 1079–1081. The codes are "optimal" and better than the Yasuda codes only in their free distance, and thus in their asymptotic coding gain at very high signal-to-noise ratios (SNR).

The present invention provides an advantage in coding gain over the prior art for a rate ½, sixteen-state code punctured to rates ¾, ⅘ and 6/7. The present invention utilizes codes which are not optimal in the traditional free-distance sense, but outperforms such "optimal" codes at low SNRs. Environments with relatively low SNRs are found in concatenated coding systems, where an inner convolutional code (e.g., a trellis code) is wrapped by an outer block code (e.g., a Reed-Solomon code). As a result of the power of the cascaded code, the inner convolutional code may operate at a low SNR.

The code provided by the present invention is also a transparent code and, as such, is highly desirable in its ability to handle 180° phase ambiguities. A binary convolutional code (BCC) is said to be transparent if the complement of any codeword is always a codeword. Since BCCs are linear codes, a BCC is transparent if and only if the "all 1's" sequence is a codeword. A transparent code always has a transparent encoder/uncoder. Such an encoder/uncoder has the property that the output of the uncoder for any codeword is the same as the output when the codeword is first inverted before being presented to the uncoder (i.e., a codeword and its complement produce the same output at the uncoder).

SUMMARY OF THE INVENTION

In accordance with the present invention, a method is provided for convolutionally encoding digital data with a rate ⅘ convolutional code. A rate ½, sixteen-state convolutional code is punctured to rate ⅘ using a puncture map of $$\left\{ \begin{array}{c} 1000 \\ 1111 \end{array} \right\}$$

and octal generators of 25, 37, wherein v=4. An incoming data stream is processed using the rate ⅘ code.

The present invention also provides a rate ⅘ convolutional encoder, in which a rate ½, sixteen-state convolutional encoder is coupled to receive an input stream to be encoded. Means are provided for puncturing the rate ½ encoder to rate ⅘ using a puncture map of $$\left\{ \begin{array}{c} 1000 \\ 1111 \end{array} \right\}$$

and octal generators 25, 37 wherein v=4.

Methods and apparatus are also provided for puncturing a rate ½, sixteen-state convolutional code to rate ¾ using a puncture map of $$\left\{ \begin{array}{c} 100 \\ 111 \end{array} \right\}$$

and octal generators of 25, 37, and for puncturing a rate ½, sixteen-state convolutional code to rate 6/7 using a puncture map of $$\left\{ \begin{array}{c} 100010 \\ 111101 \end{array} \right\}$$

and octal generators of 25, 37.

DETAILED DESCRIPTION OF THE INVENTION

It is known that the implementation of Viterbi decoders for high rate convolutional codes can be simplified if the code structure is constrained to be that of a punctured low rate code. In the past, extensive searches have been made to find the best punctured code generators at each constraint length v. The constraint length is the number of input frames of data that are held in the shift register of the convolutional encoder, as defined in greater detail in G. D. Forney, Jr., "Convolutional Codes I: Algebraic Structure," *IEEE Transactions on Information Theory*, Vol. IT-16, pp. 720–738, Nov. 1970. The "best" code is defined as that with the best performance on the additive white Gaussian noise (AWGN) channel at a large signal-to-noise ratio. Typically, the best rate ½ codes have been punctured to obtain higher rate codes, such as ⅔, ¾, ⅘, etc.

The present invention provides new codes that have better performance at lower SNRs typical of concatenated system thresholds, than prior art codes that punctured the "best" rate ½ codes. In particular, the present invention provides rate ¾, ⅘ and 6/7 punctured codes derived from a rate ½ code with v=4 and octal generators 25, 37. This differs from the optimal rate ½ code with v=4 and octal generators 23, 35 as published by Yasuda, et al. in the aforementioned article entitled "High-Rate Punctured Convolutional Codes for Soft Decision Viterbi Decoding." In order to achieve a 0.2 dB coding gain over the Yasuda, et al. punctured rate ⅘ code, for example, the present invention uses a nonoptimal rate ½ code (octal generators 25, 37) with a puncture map of $$\left\{ \begin{array}{c} 1000 \\ 1111 \end{array} \right\}.$$

Figure 1:
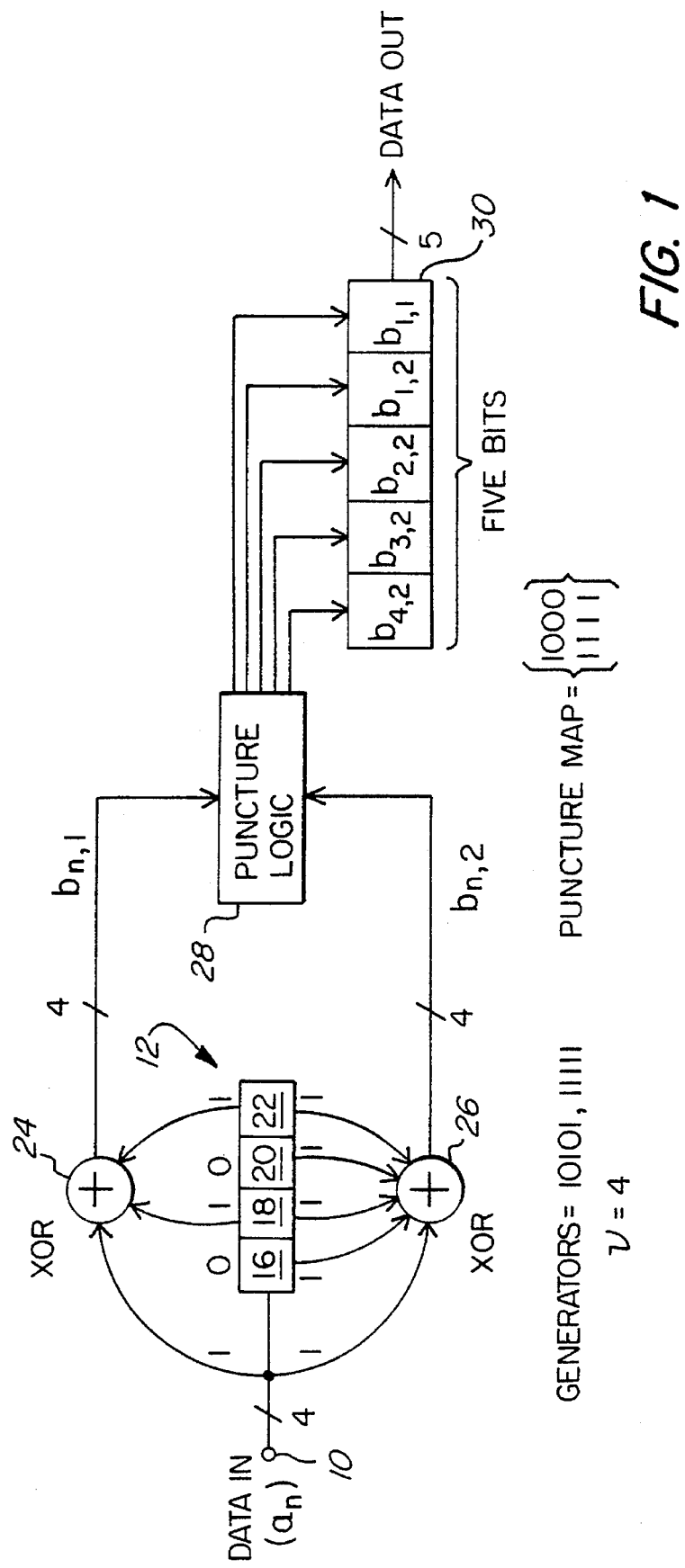
FIG. 1 is a block diagram of a punctured rate ⅘ convolutional encoder in accordance with the present invention.

A block diagram of a rate ⅘ convolutional encoder in accordance with the present invention is shown in FIG. 1. Data to be encoded, comprising a stream of incoming bits $a_1$, $a_2, \ldots a_n, \ldots$ is input to terminal 10 of a rate ½ sixteen-state convolutional encoder generally designated 12. Encoder 12 includes a four-stage shift register with stages 16, 18, 20 and 22 as well as two exclusive OR gates (XOR) 24, 26. The input of the convolutional encoder and selected taps of the shift register stages are coupled to the XOR gates in accordance with octal generators 25, 37 which, expressed in binary, comprise generators 10101, 11111. As indicated in FIG. 1, XOR gate 24 receives the input bits in accordance with generator 25 (10101) such that the incoming data stream is XOR'd with the outputs of each of shift register sections 18 and 22 to provide a bit $b_{n,1}$ for each input bit. Similarly, XOR 26 receives the original data stream together with the outputs of each of shift register stages 16, 18, 20 and 22 to provide a second bit $b_{n,2}$ for each input bit. Since each bit input to the convolutional encoder 12 results in two output bits, the encoder is referred to as a rate ½ convolutional encoder. Since the shift register contains four stages 16, 18, 20, 22, the constraint length v is 4.

In order to convert the rate ½ code of the convolutional encoder 12 to a rate ⅘ code, puncture logic 28 is provided. The puncture logic uses a puncture map $$\left\{ \begin{array}{c} 1000 \\ 1111 \end{array} \right\}$$

such that the bits output from convolutional encoder 12 which align with the zeros in the puncture map are deleted. Puncture logic 28 applies the puncture map to the bits $b_{n,1}$; $b_{n,2}$ in a pattern progressing from the top left-most bit in the puncture map to the bottom right-most bit in the puncture map, progressing from left to right and from top to bottom. Thus, for bits $a_1$, $a_2$, $a_3$ and $a_4$ input to terminal 10 of the convolutional encoder 12, bits $$\left\{ \begin{array}{cccc} b_{1,1} & b_{2,1} & b_{3,1} & b_{4,1} \\ b_{1,2} & b_{2,2} & b_{3,2} & b_{4,2} \end{array} \right\}$$

will be output and puncture pattern $$\left\{ \begin{array}{c} 1000 \\ 1111 \end{array} \right\}$$

will result in the output from puncture logic 28 of bits $b_{1,1}$; $b_{1,2}$; $b_{2,2}$; $b_{3,2}$; and $b_{4,2}$.

Puncture logic 28 will load the five output bits $b_{1,1}$; $b_{1,2}$; $b_{2,2}$; $b_{3,2}$; and $b_{4,2}$ into a shift register 30 for output in a sequential order. Thus, for each four bits input to terminal 10, five bits will be output from shift register 30 as a result of the rate ⅘ code punctured from the rate ½ convolutional encoder 12.

The error event distribution of the code of the present invention has been compared, by computer modeling, to the "optimal" v=4, rate ⅘ code published by Yasuda, et al., in which the generators were 23, 35 and the puncture map was $$\left\{ \begin{array}{c} 1010 \\ 1101 \end{array} \right\}$$

and to the v=4, rate ⅘ code published by K. J. Hole, "New Short Constraint Length Rate (n−1)/n Punctured Convolutional Codes for Soft-Decision Viterbi Decoding," *IEEE Trans. on Info. Theory*, Vol. IT-34, September 1988, pp. 1079–1081, in which the generators were 35, 31 and the puncture map was $$\left\{ \begin{array}{c} 1011 \\ 1100 \end{array} \right\}$$

with the following results:

TABLE 1

| NEW CODE | | | YASUDA, ET AL. | | | HOLE | | |
| --- | --- | --- | --- | --- | --- | --- | --- | --- |
| d | $B_d$ | $C_d$ | d | $B_d$ | $C_d$ | d | $B_d$ | $C_d$ |
| 3 | 2 | 4 | 3 | 3 | 11 | 3 | — | — |
| 4 | 10 | 48 | 4 | 16 | 78 | 4 | 53 | 312 |
| 5 | 78 | 528 | 5 | 103 | 753 | 5 | — | — | where $B_d$ is the total number of incorrect paths with distance d diverging from the correct path, and $C_d$ is the total number of error bits produced by all such incorrect paths. As can be seen from Table 1, the code of the present invention (new code) produces fewer error events for each of Hamming distances 3, 4 and 5 when compared to Yasuda, et al. and fewer error events for Hamming distance 4 when compared to Hole. The Hole code has only even weight distances (e.g., d=4), and at d=4 there are so many nearest neighbors (i.e., 53) that the new code of the present invention is clearly superior. In fact, it is believed that the present code outperforms the Hole code for any practical operating range.

Figure 2:
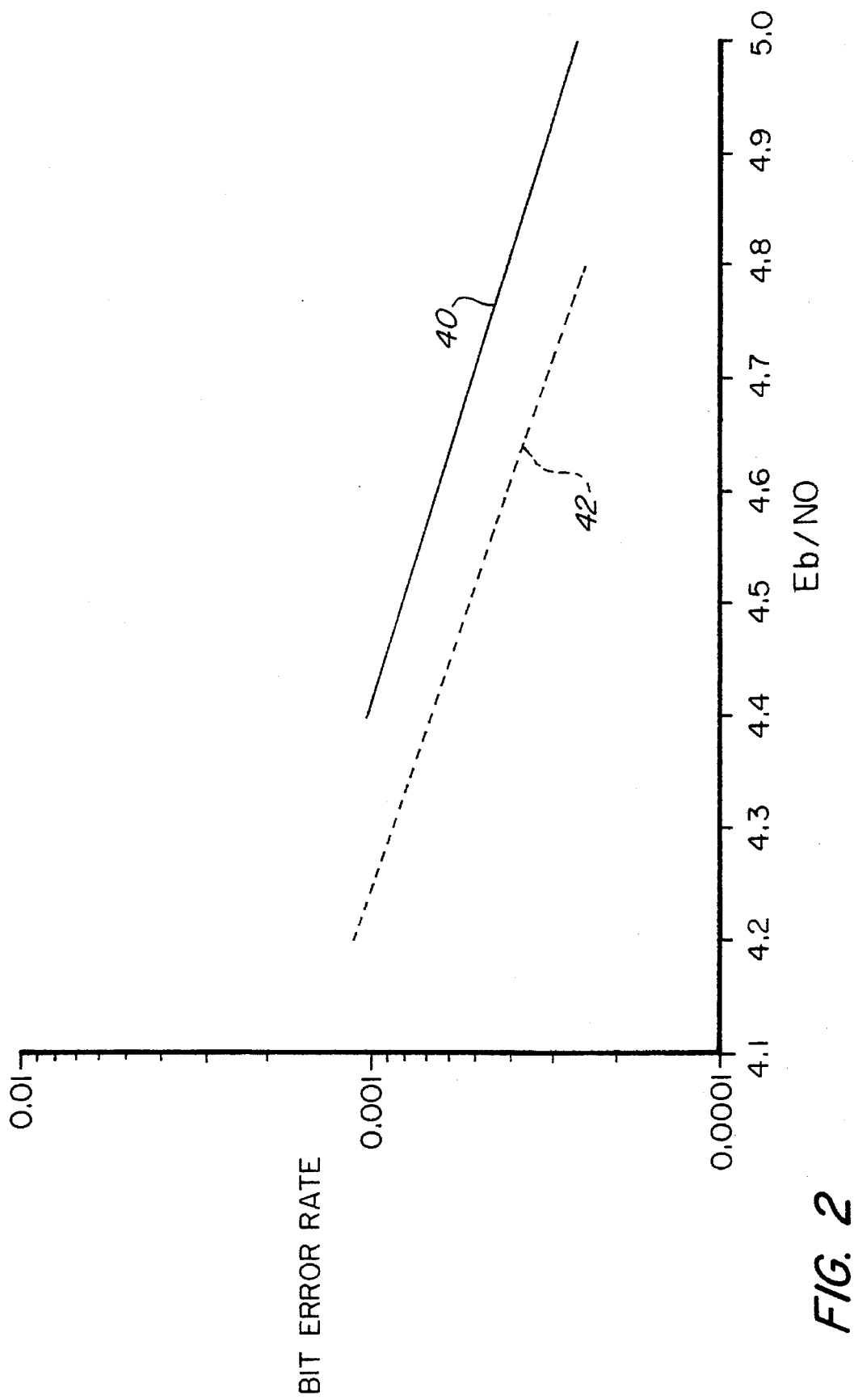
FIG. 2 is a graph comparing the coding gains of a rate ⅘ code punctured from an optimal rate ½ code and the rate ⅘ code in accordance with the present invention.

A comparison of the performance between the inventive code and the prior art "optimal" code is illustrated in FIG. 2. The code of the present invention, plotted as line 42, shows a 0.2 dB improvement in the signal-to-noise ratio (Eb/N0) at the bit error rate (BER) of interest when compared to the Yasuda, et al. "optimal" prior art code 40.

The code of the present invention also has rate 3/4 and rate 6/7 punctures which perform slightly better than the prior art Yasuda, et al. codes. A comparison between the codes at these rates is provided in Tables 2 and 3.

TABLE 2

| (Rate 3/4) | | | | | |
|---|---|---|---|---|---|
| NEW CODE 25,37 - 100,111 | | | YASUDA, ET AL. 23,35 - 101,110 | | |
| d | $B_d$ | $C_d$ | d | $B_d$ | $C_d$ |
| 3 | 0 | 0 | 3 | 1 | 1 |
| 4 | 8 | 22 | 4 | 2 | 7 |
| 5 | 0 | 0 | 5 | 23 | 125 |
| 6 | 227 | 1687 | 6 | 124 | 936 |

TABLE 3

| (Rate 6/7) | | | | | |
|---|---|---|---|---|---|
| NEW CODE 25,37 - 100010,111101 | | | YASUDA, ET AL. 23,35 - 101010,110101 | | |
| d | $B_d$ | $C_d$ | d | $B_d$ | $C_d$ |
| 3 | 12 | 47 | 3 | 14 | 69 |
| 4 | 92 | 710 | 4 | 100 | 779 |
| 5 | 767 | 9362 | 5 | 828 | 9770 |

Figure 3:
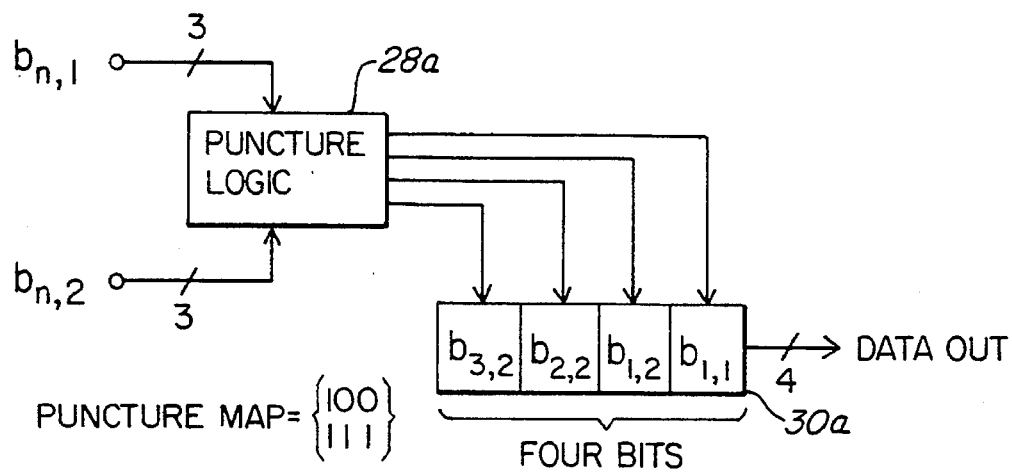
FIG. 3 is a block diagram of the puncture logic and output registers for a punctured rate ¾ convolutional encoder in accordance with the present invention.
Figure 4:
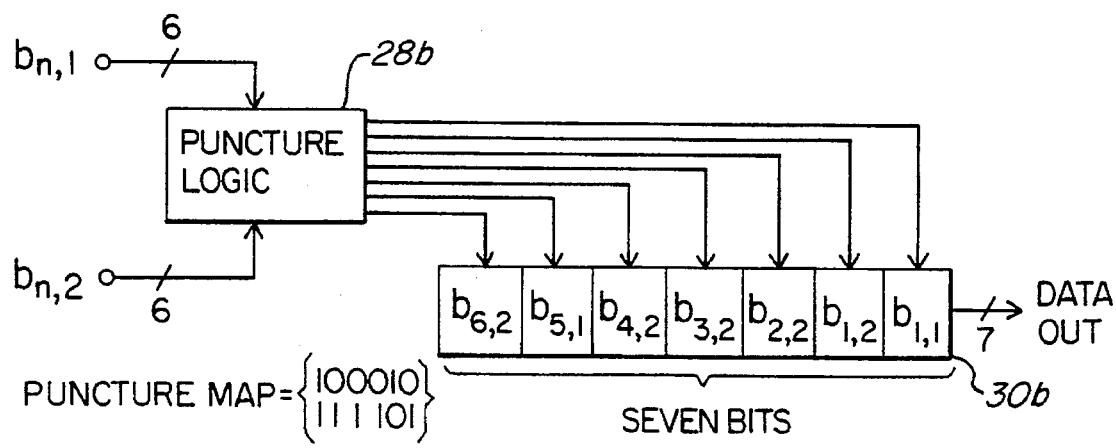
FIG. 4 is a block diagram of the puncture logic and output registers for a punctured rate 6/7 convolutional encoder in accordance with the present invention.

The puncture logic for the new rate 3/4 and rate 6/7 codes is illustrated in FIGS. 3 and 4, respectively. In FIG. 3, puncture logic 28a outputs selected bits to shift register 30a in accordance with puncture map $$\left\{ \begin{array}{c} 100 \\ 111 \end{array} \right\}.$$

In FIG. 4, puncture logic 28b outputs selected bits to shift register 30b in accordance with puncture map $$\left\{ \begin{array}{c} 100010 \\ 111101 \end{array} \right\}.$$

It should now be appreciated that the present invention provides a method of convolutionally encoding digital data with a rate 4/5 convolutional code that provides a coding gain of about 0.2 dB over the best known prior punctured rate 4/5 code. Punctured rate 3/4 and 6/7 codes are also provided. The invention obtains the improvement by working from a nonoptimal rate 1/2 code (octal generators 25, 37) which is then punctured according to specific puncture maps to a rate 3/4, 4/5 or 6/7 code.

Although the invention has been described in connection with a specific embodiment thereof, it will be appreciated that numerous adaptations and modifications may be made thereto, without departing from the spirit and scope thereof as set forth in the claims.

We claim:

1. A method for convolutionally encoding digital data with a rate 4/5 convolutional code, comprising the steps of:

puncturing a rate 1/2, sixteen state convolutional code based on octal generators 25,37 to rate 4/5 using a puncture map of $$\left\{ \begin{array}{c} 1000 \\ 1111 \end{array} \right\}$$

wherein v=4; and processing an incoming data stream using said rate 4/5 code.

2. A rate 4/5 convolutional encoder comprising:

a rate 1/2, sixteen state convolutional encoder based on octal generators 25,37 coupled to receive an input stream to be encoded; and means for puncturing the code from said rate 1/2 encoder to rate 4/5 using a puncture map of $$\left\{ \begin{array}{c} 1000 \\ 1111 \end{array} \right\}$$

wherein v=4.

3. A method for convolutionally encoding digital data with a rate 6/7 convolutional code, comprising the steps of:

puncturing a rate 1/2, sixteen state convolutional code based on octal generators 25,37 to rate 6/7 using a puncture map of $$\left\{ \begin{array}{c} 100010 \\ 111101 \end{array} \right\}$$

wherein v=4; and processing an incoming data stream using said rate 6/7 code.

4. A rate 6/7 convolutional encoder comprising:

a rate 1/2, sixteen state convolutional encoder based on octal generators 25,37 coupled to receive an input stream to be encoded; and means for puncturing the code from said rate 1/2 encoder to rate 6/7 using a puncture map of $$\left\{ \begin{array}{c} 100010 \\ 111101 \end{array} \right\}$$

wherein v=4.

* * * * *